(12) United States Patent  (10) Patent No.: US 8,060,790 B2
Sakiyama et al.  (45) Date of Patent: Nov. 15, 2011

(54) SEMICONDUCTOR INTEGRATED CIRCUIT AND DEBUGGING SYSTEM

(75) Inventors: Jun Sakiyama, Musashino (JP); Naoki Kato, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 350 days.

(21) Appl. No.: 12/182,183

(22) Filed: Jul. 30, 2008

(65) Prior Publication Data

US 2009/0044059 A1  Feb. 12, 2009

(30) Foreign Application Priority Data

Aug. 6, 2007  (JP) ................................. 2007-204091

(51) Int. Cl.
  *G06F 11/00*  (2006.01)
(52) U.S. Cl. ................. 714/45; 714/39; 714/40; 714/41; 717/128; 717/130; 717/133
(58) Field of Classification Search .............. 714/39–41, 714/45; 717/128, 130, 133
  See application file for complete search history.

(56) References Cited

U.S. PATENT DOCUMENTS

| | | | | |
|---|---|---|---|---|
| 4,905,204 A * | 2/1990 | Hughes | ............................ | 367/62 |
| 5,357,626 A * | 10/1994 | Johnson et al. | ................. | 714/33 |
| 5,408,650 A * | 4/1995 | Arsenault | ...................... | 717/124 |
| 5,450,575 A * | 9/1995 | Sites | ............................ | 717/128 |
| 5,943,498 A | 8/1999 | Yano et al. | | |
| 6,604,210 B1 * | 8/2003 | Alexander et al. | ............... | 714/39 |
| 6,678,883 B1 * | 1/2004 | Berry et al. | .................... | 717/128 |
| 6,751,789 B1 * | 6/2004 | Berry et al. | .................... | 717/130 |
| 7,318,017 B2 * | 1/2008 | Swoboda | ......................... | 703/28 |
| 2002/0178403 A1 * | 11/2002 | Floyd et al. | ...................... | 714/39 |
| 2003/0051122 A1 | 3/2003 | Sato | | |
| 2004/0073838 A1 * | 4/2004 | Tabe | ............................... | 714/29 |
| 2004/0103349 A1 * | 5/2004 | Nardini et al. | .................. | 714/39 |
| 2004/0153836 A1 * | 8/2004 | Nardini et al. | .................. | 714/39 |

(Continued)

FOREIGN PATENT DOCUMENTS

JP  8-185336 A  7/1996

(Continued)

OTHER PUBLICATIONS

Milenkovic, "Exploiting Streams in Instruction and Data Address Trace Compression" Mar. 2003, IEEE, pp. 1-9.*

*Primary Examiner* — Bryce P Bonzo
*Assistant Examiner* — Jeison C Arcos
(74) *Attorney, Agent, or Firm* — Miles & Stockbridge P.C.

(57) ABSTRACT

This invention is to provide a technology for taking out trace information externally without lacking under the condition of limited output bandwidth. A semiconductor integrated circuit provided includes: a processing unit which can perform arithmetic processing according to a predetermined program and can output trace information with respect to the arithmetic processing; and a trace compression unit which can compress the trace information outputted from the processing unit. The trace compression unit includes a storage device, a comparator unit which can compare trace information stored in the storage device and the trace information newly outputted from the processing unit, and a trace information compression controller which can compress trace information to be externally outputted, based on the comparison result of the comparator unit. When a content of the trace information is in agreement with that of the trace information already outputted, information indicating the already-outputted trace information is outputted, accordingly the trace information is compressed.

10 Claims, 5 Drawing Sheets

U.S. PATENT DOCUMENTS

| | | | |
|---|---|---|---|
| 2005/0028145 A1* | 2/2005 | Kang et al. | 717/128 |
| 2005/0268177 A1* | 12/2005 | John | 714/47 |
| 2006/0150023 A1* | 7/2006 | Hasebe et al. | 714/38 |
| 2006/0248397 A1* | 11/2006 | Johnsen et al. | 714/30 |
| 2007/0150871 A1* | 6/2007 | Barsness et al. | 717/128 |
| 2007/0265823 A1* | 11/2007 | Cha et al. | 703/24 |
| 2007/0283338 A1* | 12/2007 | Gupta et al. | 717/154 |

FOREIGN PATENT DOCUMENTS

| | | |
|---|---|---|
| JP | 11-219293 A | 8/1999 |
| JP | 2001-005689 A | 1/2001 |
| JP | 2003-85000 A | 3/2003 |

* cited by examiner

SEMICONDUCTOR INTEGRATED CIRCUIT AND DEBUGGING SYSTEM

CLAIM OF PRIORITY

The Present application claims priority from Japanese patent application JP 2007-204091 filed on Aug. 6, 2007, the content of which is hereby incorporated by reference into this application.

BACKGROUND OF THE INVENTION

The present invention relates to a semiconductor integrated circuit such as a micro-processor, and a debugging system for program development supports.

In recent years, demand of shortening the development cycle of the system which mounts a micro-processor is increasing, and a debugging support function which supports program development is frequently provided in the micro-processor. Especially the trace information output function that outputs externally trace information, such as a flow of the program which the micro-processor has executed, and updating of data, is an important function for supporting the program development. The trace information supplied externally is taken into a debugging device coupled to the micro-processor and utilized for the analysis of execution of a program. However, the trace information is increasing in quantity due to improvement in the speed of the micro-processor, and it is not easy to take out the increasing trace information to the exterior of the micro-processor. In order to take out the trace information to the exterior of the micro-processor, a pin must be provided in the micro-processor. Although the trace information output bandwidth can be improved by the increase in the number of the pin, and by raising the frequency of an output circuit, the increase in the number of the pin and raising the frequency of the output circuit lead to increase of the cost of the micro-processor. Therefore, there are limitations in improving the trace information output bandwidth. Although the trace information is stored in a memory inside the micro-processor, the memory also has a limitation in capacity. The technology of a branch trace is known as an example of the trace information output for reproducing the flow of processing of a program (for example, refer to Patent Document 1). In the technique, when a branch occurs in a program execution process, a branch destination address and a branch source address are outputted externally. According to the method, it is possible to reproduce the program execution flow without outputting all the instruction execution processes, suppressing the output quantity of the trace information. In this method, the information on the same branch trace is repeatedly outputted for the loop part in a program. To cope with the issue, Patent Document 2 discloses a technology which provides a loop decision circuit. The loop decision circuit is able to suppress the trace output and to reduce trace information by detecting that an instruction is under execution inside of a loop, and to control the start of trace information extraction by detecting that the instruction is under execution outside the loop. Patent Document 3 discloses another technology which detects a loop and controls to delete a repetitive middle part of the loop, leaving only the last loop.

[Patent Document 1] Japanese Unexamined Patent Publication No. Hei 8(1996)-185336

[Patent Document 2] Japanese Unexamined Patent Publication No. 2001-5689

[Patent Document 3] Japanese Unexamined Patent Publication No. Hei 11(1999)-219293

SUMMARY OF THE INVENTION

Since the output bandwidth for acquiring trace information has a limitation as mentioned above, it is difficult to acquire whole trace output which a high-speed CPU outputs. A branch trace method has an effect in suppressing trace information to some extent. In the branch trace method, in order to reproduce a program execution flow, trace information is not outputted when execution progresses in order of the program address, but outputted when the execution shifts to a discontinuous address by a branch instruction etc. However, even the branch trace method encounters a problem that the trace output becomes difficult, when the branch instruction occurs continuously. Taking notice of the point that a cause of continuous occurrence of the branch instruction lies in the loop processing in a program, the related technology disclosed by Patent Document 2 does not output the trace information in the loop, and the related technology disclosed by Patent Document 3 outputs the trace information only on the last loop. However, the program execution flow in a loop may also differ for every time of the loop. For example, in the program which includes a conditional statement such as "if" sentence in a "for" loop, the execution flow may change for every time of the execution of the loop, even if the loop is repeated many times. Therefore, in order to reproduce the program execution flow faithfully, it is desirable to acquire all the trace information even in the loop. In debugging of a program, it is also demanded to output the trace information for reproducing the program execution flow, combined with the data trace which outputs predetermined data whenever data is updated for example. There is an increased request also in this case to acquire the information on updating of data in a loop. As described above, the related technologies have failed in taking into consideration the issue that the trace information is to be acquired even in a loop without lacking.

The present invention has been made in view of the above circumstances and provides the technology for taking out trace information externally without lacking under the condition of limited output bandwidth.

The above-described and other purposes and the new features of the present invention will become clear from the description of the present specification to be given in the following and the accompanying drawings.

The following is a brief explanation of typical one of the inventions disclosed in the present application.

That is, there is provided a semiconductor integrated circuit including: a processing unit which can perform arithmetic processing according to a predetermined program and can output trace information with respect to the arithmetic processing; and a trace compression unit which can compress the trace information outputted from the processing unit. The trace compression unit includes: a storage device which can store the trace information outputted from the processing unit; a comparator unit which can compare trace information stored in the storage device with the trace information newly outputted from the processing unit; and a trace information compression controller which can compress trace information to be externally outputted, based on the comparison result of the comparator unit.

According to the means described above, compression of the trace information is enabled by outputting the information indicative of the trace information already outputted, when the contents of the trace information is the same as the trace information which has been already outputted.

The effect obtained by the typical one of the inventions disclosed in the present application is briefly explained as follows.

That is, when the content of trace information is the same as the trace information already outputted, it becomes possible to compress the trace information by outputting the information indicative of the information already outputted. Accordingly, it is possible to provide the technology for taking out externally the trace information without lacking under condition of a limited output bandwidth.

DETAILED DESCRIPTION OF THE PREFERRED EMBODIMENTS

1. Typical Embodiment

Figure 1:
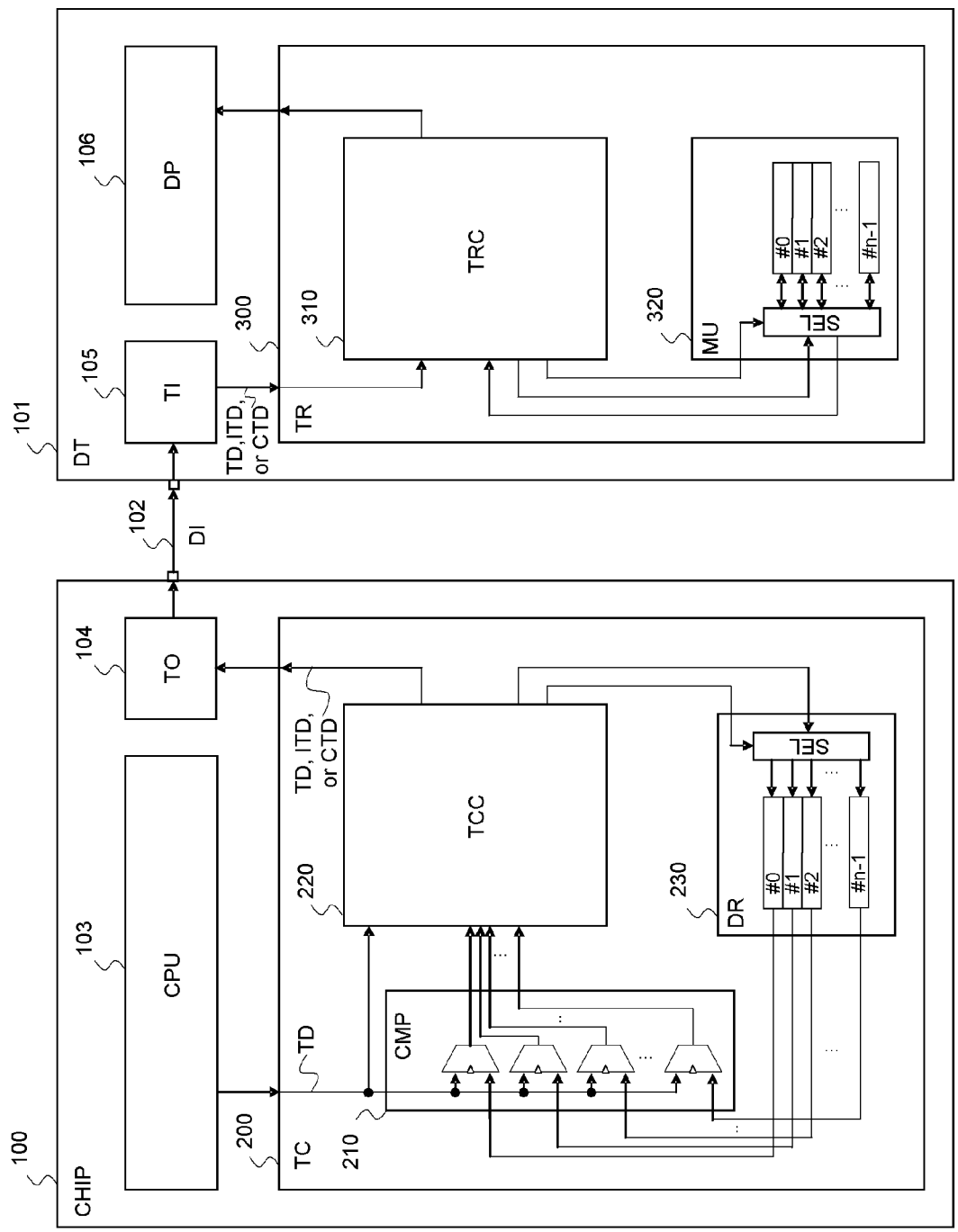
FIG. 1 is a block diagram illustrating an example of overall configuration of a debugging system in a first embodiment of the present invention.

First, an outline is explained about a typical embodiment of the invention disclosed in the present application. A numerical symbol in parentheses referring to a component of the drawing in the outline explanation about the typical embodiment only illustrates what is included in the concept of the component to which the numerical symbol is attached.

[1] A semiconductor integrated circuit (100) according to the typical embodiment of the present invention includes a processing unit (103) which can perform arithmetic processing according to a predetermined program and to output trace information with respect to the arithmetic processing, and a trace compression unit (200) which can compress the trace information outputted from the processing unit. The trace compression unit includes a storage device (230) which can store the trace information outputted from the processing unit, a comparator unit (210) which can compare trace information stored in the storage device and the trace information newly outputted from the processing unit, and a trace information compression controller (220) which can compress trace information to be newly, externally outputted, based on the comparison result of the comparator unit.

[2] When the newly-outputted trace information from the processing unit is in disagreement with the trace information stored in the storage device, the trace information compression controller stores the newly-outputted trace information in the storage device after appending an index number to the newly-outputted trace information. When the newly-outputted trace information from the processing unit is in agreement with the trace information stored in the storage device, the trace information compression controller compresses the trace information to be externally outputted by replacing the trace information to be externally outputted with an index number appended to the trace information concerned in the storage device.

[3] When the newly-outputted trace information from the processing unit is in disagreement with the trace information stored in the storage device, the trace information compression controller stores the newly-outputted trace information in the storage device after appending an index number to the newly-outputted trace information. When the newly-outputted trace information from the processing unit is in agreement with the trace information stored in the storage device, the trace information compression controller compresses the trace information to be externally outputted by replacing the trace information to be externally outputted with information indicative of storing order of the trace information concerned in the storage device.

[4] The trace information compression controller includes a register which can set up information serving as a compression target in the trace information, and the information serving as the compression target is determined according to the setting information in the register concerned.

[5] The storage device includes plural registers each of which can store trace information outputted from the processing unit, and the comparator unit includes plural comparators each of which can compare the trace information stored in each of the registers with the newly-outputted trace information from the processing unit.

[6] A debugging system can be constituted by the semiconductor integrated circuit possessing the configuration described above and a debugging terminal (101) which can restore information outputted from the semiconductor integrated circuit.

[7] The debugging terminal may include a trace restoring unit (300) which can restore trace information by replacing the trace information with the contents of the trace information indicated by the index number.

[8] The debugging terminal may include a trace restoring unit (300) which can restore trace information by replacing the trace information with the information indicative of the storing order of the trace information in the storage device.

2. Explanation of Embodiment

Next, the embodiment is explained further in full detail.

First Embodiment

FIG. 1 is a block diagram illustrating a debugging system in a first embodiment of the present invention. The debugging system illustrated in FIG. 1 includes a micro-processor (CHIP) 100, a debugging terminal (DT) 101 arranged in the exterior of the micro-processor (CHIP) 100, and a debugging interface (DI) 102.

Although not restricted in particular, the micro-processor (CHIP) 100 includes a processing unit (CPU) 103, a trace output unit (TO) 104, and a trace compression unit (TC) 200. The micro-processor (CHIP) 100 may be formed on a piece of semiconductor substrate, such as a single crystal silicone substrate, by a publicly known semiconductor integrated circuit manufacturing technology.

The debugging terminal (DT) 101 includes a trace input unit (TI) 105, a trace restoring unit (TR) 300, and a debug processing unit (DP) 106.

The processing unit (CPU) 103 performs arithmetic processing according to a predetermined program, and outputs information indicating operation of instruction execution, memory access, etc., as trace information. The trace output unit (TO) 104 outputs the trace information (TD) to the debugging interface (DI) 102 in conformity with a specified communication protocol. The trace input unit (TI) 105 receives the trace information (TD) inputted to the debugging interface (DI) 102 in conformity with the specified communication protocol. The debug processing unit (DP) 106 analyzes the behavior of CPU based on the trace information restored by the trace restoring unit (TR) 300.

The trace compression unit (TC) 200 compresses the trace information acquired from the processing unit (CPU) 103, and outputs the compressed trace information to the trace output unit (TO) 104.

The trace restoring unit (TR) 300 receives the trace information from the trace input unit (TI) 105, restores the received trace information to the state before compression, and outputs the restored trace information to the debug processing unit (DP) 106.

The trace compression unit (TC) 200 includes a comparator unit (CMP) 210, a trace compression controller (TCC) 220, and a data register (DR) 230.

The comparator unit (CMP) 210 compares the trace information inputted into the trace compression unit (TC) 200 with the trace information stored in the data register (DR) 230, and outputs the comparison result to the trace compression controller (TCC) 220. In the comparator unit (CMP) 210, plural comparators are provided so that comparison with plural pieces of the trace information stored in the data register (DR) 230 can be performed at the same time. To the trace information inputted into the trace compression unit (TC) 200, the trace compression controller (TCC) 220 carries out one of the three operations: (1) to perform nothing, (2) to append a zero to (n−1)th index number to the trace information, and (3) to compress the trace information using an index number. The trace compression controller (TCC) 220 carries out one of the three operations, employing the comparison result inputted from the comparator unit (CMP) 210 and outputs the carried-out operation result to the trace output unit (TO) 104. The trace compression controller (TCC) 220 also controls the read/write of data to registers #0-#(n−1) of the data register (DR) 203. When the operation of (2) to append the index number to the trace information is carried out, the trace compression controller (TCC) 220 stores the trace information to a register which possesses the same number as the index number appended to the trace information among n pieces of the registers #0-#(n−1) in the data register (DR) 203. Due to the above-described function, the register number can attain correspondence with the index number.

The data register (DR) 230 possesses n pieces of registers #0-#(n−1), and stores to the registers the trace information which is inputted to the trace compression controller (TCC) 220, under the data read/write control of the trace compression controller (TCC) 220. The data register (DR) 230 outputs the value of the registers #0-#(n−1) to the comparator unit (CMP) 210.

Figure 2:
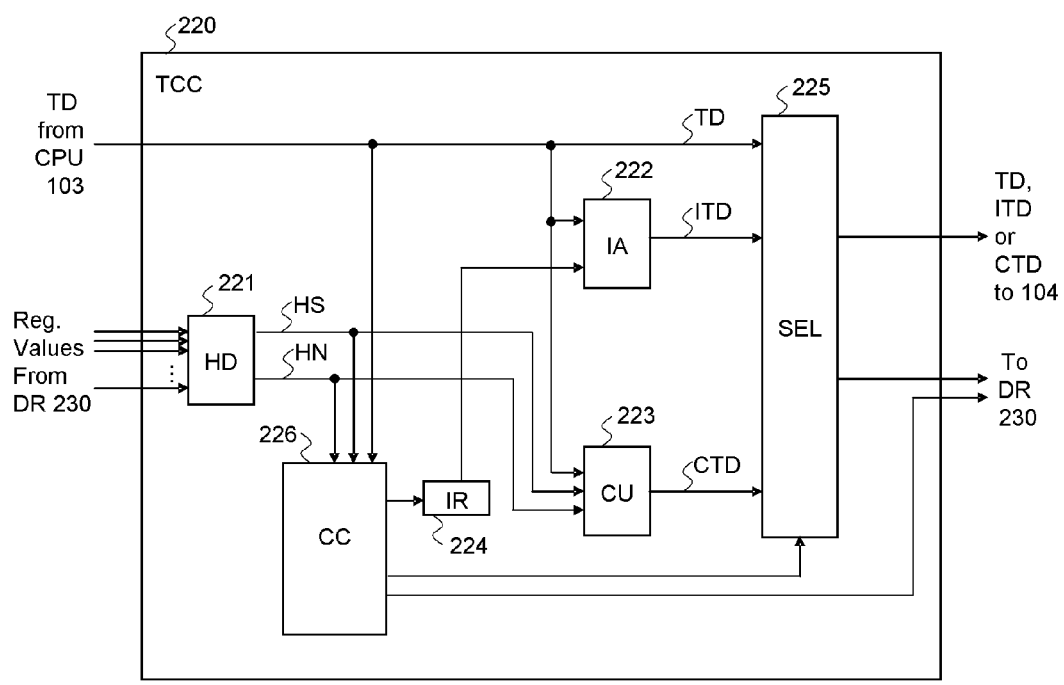
FIG. 2 is a block diagram illustrating an example of configuration of a trace compression controller in the first embodiment.

FIG. 2 is a block diagram illustrating a detailed configuration of the trace compression controller(TCC) 220.

The trace compression controller (TCC) 220 includes a coincidence detection unit (HD) 221, an index appending unit (IA) 222, a compression unit (CU) 223, an index register (IR) 224, a selector (SEL) 225, and a compression controller (CC) 226. The coincidence detection unit (HD) 221 receives a comparison result from the comparator unit (CMP) 210, and generates two signals, a coincidence detection signal (HS) and a coincidence register number (HN). The index appending unit (IA) 222 appends the index number inputted from the index register (IR) 224 to the trace information (TD) inputted, generates index-numbered trace information (ITD), and outputs the generated index-numbered trace information (ITD) to the selector (SEL) 225. The compression unit (CU) 223 compresses the inputted trace information and output the compressed trace information to the selector (SEL) 225. As information which is necessary in compression, two signals, the coincidence detection signal (HS) and the coincidence register number (HN), are inputted from the coincidence detection unit (HD) 221. When the coincidence detection signal (HS) indicates coincidence, the coincidence register number (HN) is equal to the index number corresponding to the inputted trace information. Consequently, the compression unit (CU) 223 compresses the inputted trace information (TD) using the index number (equal to the coincidence register number (HN)) to generate compressed trace information (CTD), and outputs the compressed trace information (CTD) generated to the selector (SEL) 225. When the coincidence detection signal (HS) does not indicate coincidence, the trace information is not compressed.

Figure 3:
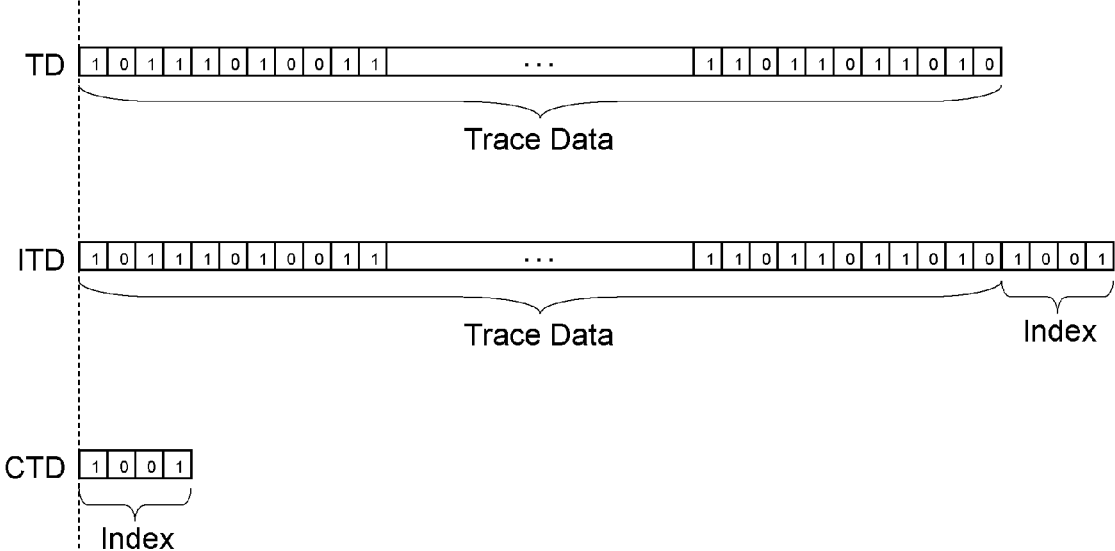
FIG. 3 is an explanatory chart of trace information in the first embodiment.

FIG. 3 illustrates the relationship of the trace information (TD: Trace Data), the index-numbered trace information (ITD), and the compressed trace information (CTD).

The index register (IR) 224 holds the value of index (Index) to be appended by the index appending unit (IA) 222, and outputs the value of index to the index appending unit (IA). The selector (SEL) 225 selects one of: (1) the trace information (TD) inputted to the trace compression controller (TCC) 220, (2) the index-numbered trace information (ITD) to which the index number has been appended by the index appending unit (IA) 222, and (3) the compressed trace information (CTD) compressed by the compression unit (CU) 223 using the index number. Subsequently, the selector (SEL) 225 outputs the selected information to the trace output unit (TO) 104 and the data register (DR) 230. The outputs to the both are independent and can possess separate values respectively. Selection of the output signal and the output destination is controlled by a signal inputted from the compression controller (CC) 226. The trace information (TD) which has been inputted to the trace compression controller (TCC) 220, and the coincidence detection signal (HS) and the coincidence register number (HN) which have been outputted by the coincidence detection unit (HD) 221 are inputted to the compression controller (CC) 226. The compression controller (CC) 226 performs the control of the index register (IR) 224, the control of the selector (SEL) 225, and the read/write control of the data register (DR) 230.

The trace restoring unit (TR) 300 includes a trace restoration controller (TRC) 310 and a storage unit (MU) 320. The trace restoration controller (TRC) 310 controls the storage unit (MU) 320, and performs read/write of trace information to a storage region corresponding to one of the index numbers #0-#(n−1) of the storage unit (MU) 320. To the trace information inputted into the trace restoring unit (TR) 300, the trace restoration controller (TRC) 310 carries out one of the three operations: (1) to perform nothing, (2) in the case of the index-numbered trace information (ITD), to remove the index number and to restore the original trace information (TD) and (3) in the case of the compressed trace information (CTD) compressed by the index number, to restore the original trace information (TD) from the compressed trace information (CTD). The trace restoration controller (TRC) 310 outputs the restored trace information to the debug processing unit (DP) 106. When the operation (2) to remove the index number is performed, the trace restoration controller (TRC) 310 stores the trace information (TD) after removal in the storage region corresponding to the index number of the storage unit (MU) 320. When the operation (3) to restore the original trace information (TD) from the compressed trace information (CTD) is performed, the trace restoration controller (TRC) 310 reads the index number currently recorded within the compressed trace information (CTD), and reads the trace information from the storage region corresponding to the index number in the storage unit (MU) 320. The storage unit (MU) 320 possesses n pieces of storage regions #0-#(n−1) and can perform read/write of the trace information to each of the storage regions. Following the control of the data read/write by the trace restoration controller (TRC) 310, the storage unit (MU) 320 performs the read/write of the trace information with the trace compression controller (TCC) 220.

Figure 4:
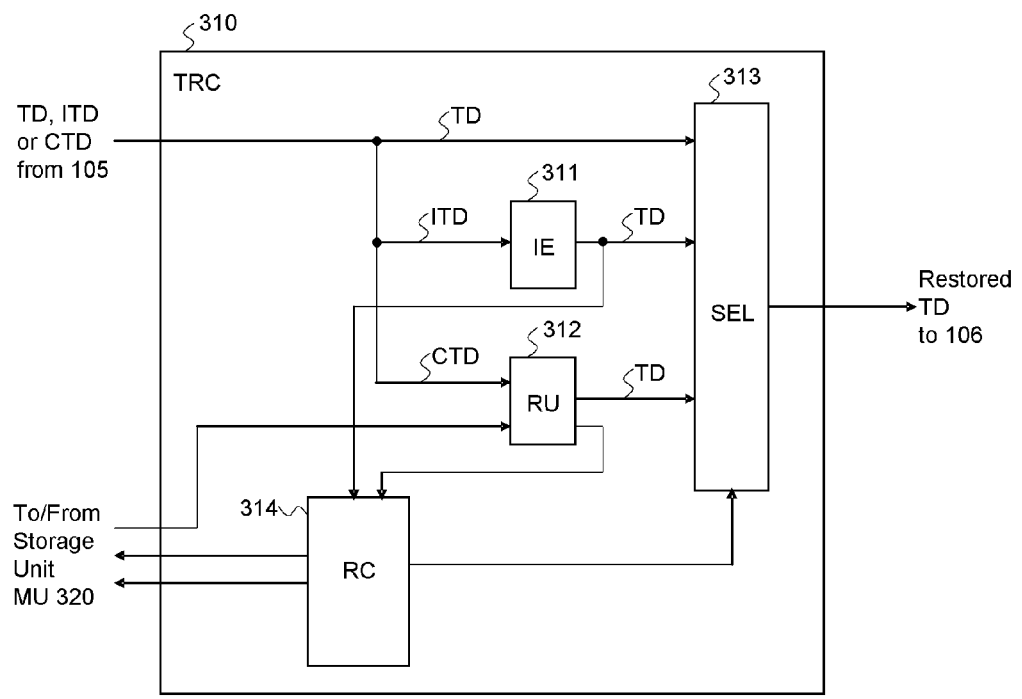
FIG. 4 is a block diagram illustrating an example of configuration of a trace restoration controller in the first embodiment.

FIG. 4 is a block diagram illustrating an example of detailed configuration of the trace restoration controller (TRC) 310.

The trace restoration controller (TRC) 310 includes an index eliminator (IE) 311, a restoring unit (RU) 312, a selector (SEL) 313, and a restoration controller (RC) 314.

The index eliminator (IE) 311 restores the trace information (TD) by removing the index from the indexed trace information (ITD) inputted into the trace restoration controller (TRC), and outputs the restored trace information (TD) to the selector (SEL) 313 and the restoration controller (RC). The restoring unit (RU) 312 reads the index number used for compression in the compressed trace information (CTD) inputted to the trace restoration controller (TRC) and outputs the index number read to the restoration controller (RC) 314. Under the control of the restoration controller (RC) 314, the pre-compression trace information (TD) corresponding to the index number is inputted from the storage unit (MU) 320 to the restoring unit (RU) 312. The restoring unit (RU) 312 outputs the pre-compression trace information (TD) to the selector (SEL) 313. The selector (SEL) 313 outputs, to the debug processing unit (DP) 106, one of the following three: (1) the trace information (TD) inputted into the trace restoration controller (TRC) 310, (2) the restored trace information (TD) by removing the index by the index eliminator (IE) 311, and (3) the trace information (TD) obtained by restoring the compressed trace information (ITD) by the restoring unit (RU) 312. The selection of the output signal is controlled by a signal inputted from the restoration controller (RC) 314.

The trace information (TD) after the index is removed by the index eliminator (IE) 311 and the index number read by the restoring unit (RU) 312 are inputted to the restoration controller (RC) 314. According to these two inputs, the control of the selector (SEL) 313 and the read/write control of the storage unit (MU) 320 are performed.

According to the present embodiment, the following effects can be obtained.

(1) When the content of trace information is the same as the content of the trace information already outputted, it becomes possible to compress the trace information by outputting information indicative of the trace information already outputted. Accordingly, it becomes possible to compress greatly, for example, the trace information having the same data yielded from a loop in branch trace, or the trace information in case where data does not change in data trace. Furthermore, even in case of multiple loops or in case where a conditional branch exists within a loop, the trace information can be compressed efficiently without lacking.

(2) According to the debugging terminal (DT) 101, the trace information compressed by the micro-processor (CHIP) 100 can be restored to the original information. Accordingly, satisfactory debugging can be performed in the debugging terminal (DT) 101.

(3) Shortening of the development cycle of micro-processor application systems, such as a mobile-phone, digital appliances, and a control system of a vehicle, can be promoted by the effects described in (1) and (2).

Second Embodiment

Next, a second embodiment of the present invention will be explained, with reference to FIGS. 5-7.

In the first embodiment, an index number is employed for compression and restoration of the trace information, and the trace information before compression and the trace information after compression are associated by using the same index number for the trace information before compression and the trace information after compression.

In the second embodiment, an index number is not used for compression and restoration of the trace information. Instead of the index number, information indicative of order how new the trace information concerned is in the trace information outputted in the past is employed.

The block diagram of entire configuration of a debugging system according to the second embodiment is the same as that of the debugging system according to the first embodiment illustrated in FIG. 1. However, among the components shown in FIG. 1, there is difference with the internal configuration of the trace compression controller (TCC) 220 explained in detail in FIG. 2 and with the internal configuration of the trace restoration controller (TRC) 310 explained in detail in FIG. 4.

Figure 5:
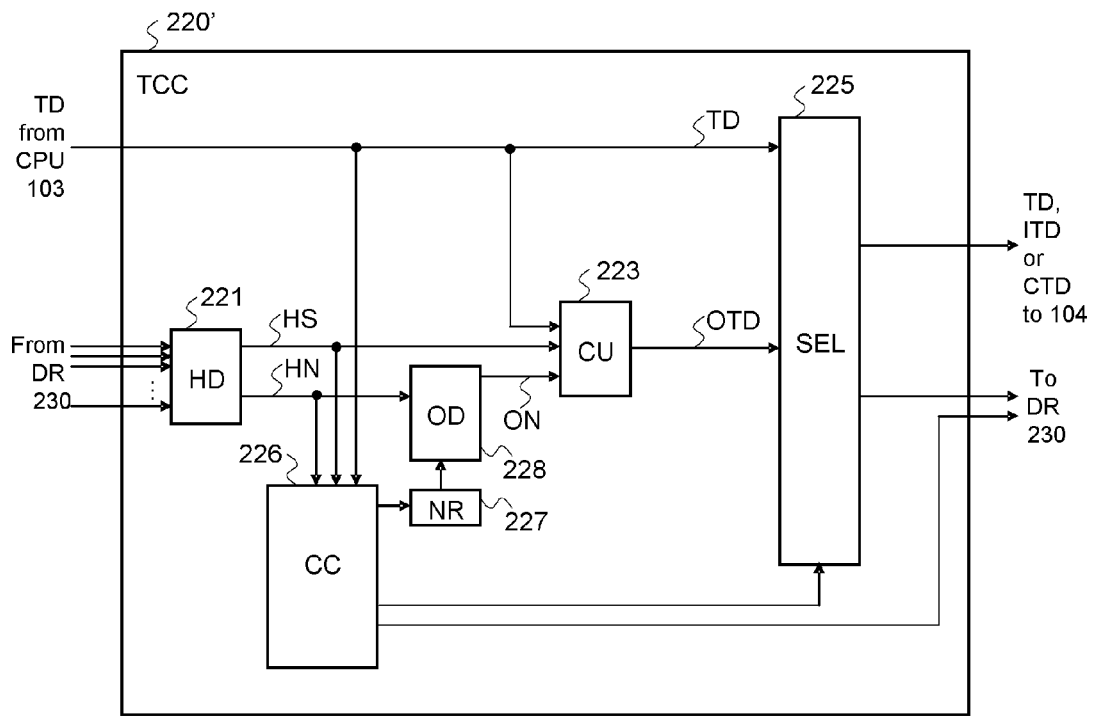
FIG. 5 is a block diagram illustrating an example of configuration of a trace compression controller in a second embodiment of the present invention.
Figure 7:
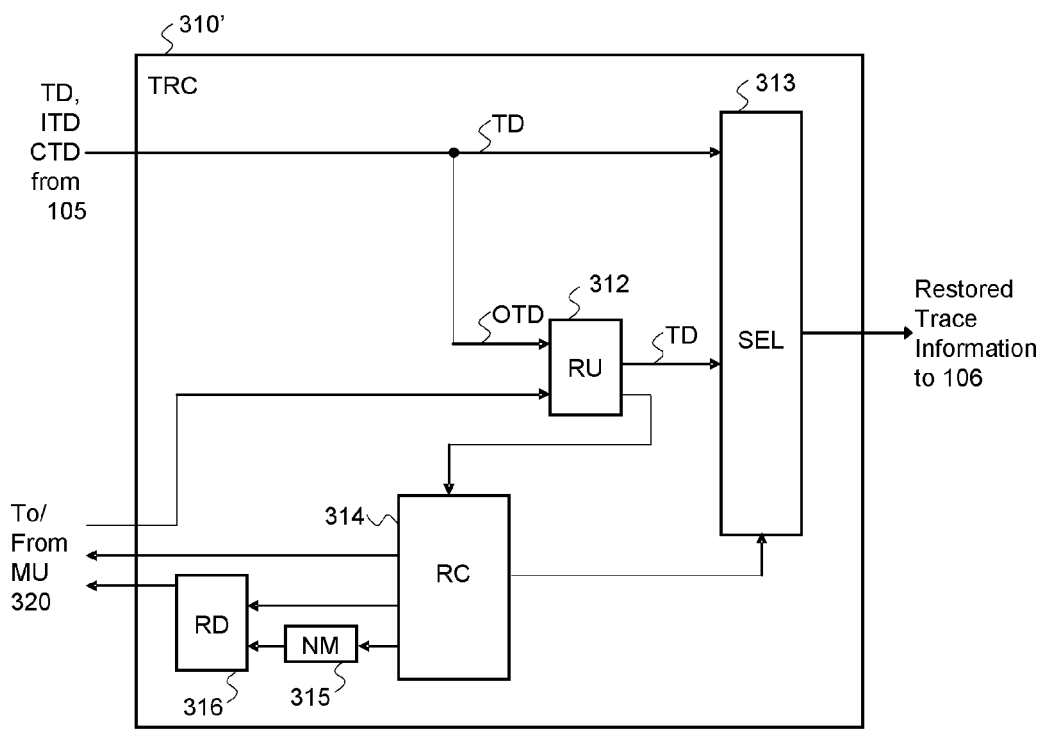
FIG. 7 is a block diagram illustrating an example of configuration of a trace restoration controller in the second embodiment.

FIG. 5 is a block diagram illustrating a detailed configuration of a trace compression controller (TCC) 220' according to the second embodiment, and FIG. 7 is a block diagram illustrating a detailed configuration of a trace restoration controller (TRC) 310' according to the second embodiment.

In comparison with the trace compression controller (TCC) 220 illustrated in FIG. 2 in the first embodiment, the trace compression controller (TCC) 220' illustrated in FIG. 5 in the second embodiment removes the index appending unit (IA) 222 and the index register (IR) 224, and adds instead a newest number register (NR) 227 and an order determination unit (OD) 228.

When storing the inputted trace information in the data register (DR) 230, the compression controller (CC) 226 according to the second embodiment stores the trace information in n pieces of registers #0-#(n−1) of the data register (DR) 230, in order of register #0, register #1, register #2, .... When the register is used up to register #(n−1), then register #0 is used for the next turn. Information indicative of what number register of the n-piece registers currently stores the newest trace information is recorded in the newest number register (NR) 227. For example, when the value of NR is 5, the newest trace information is stored in register #5, the second newest trace information is stored in register #4, and the third newest trace information is stored in register #3. Register #2 or the remaining registers store the trace information in the same order.

The newest number register (NR) 227 of the second embodiment stores the information indicative of what number register of the n-piece registers currently stores the newest trace information, and outputs the information to the order determination unit (OD) 228. The order determination unit (OD) 228 calculates what order newest the trace information stored at the coincidence register is, from the value of the newest number register (NR) 227 and the value of the coincidence register number (HN). The order determination unit (OD) 228 outputs the order as an order number (ON) to the compression unit (CU) 223. The compression unit (CU) 223 compresses the inputted trace information and outputs the compressed trace information to the selector (SEL) 225. As information necessary for compression, two signals, a coincidence detection signal (HS) from the coincidence detection unit (HD) 221 and the order number (ON) from the order determination unit (OD), are inputted. When the coincidence detection signal (HS) indicates coincidence, the order number (ON) indicates what order newest the inputted trace information is. Consequently, the compression unit (CU) 223 compresses the inputted trace information (TD) using the order number (ON), generates an order compression trace information (OTD), and outputs it to the selector (SEL) 225. When the coincidence detection signal (HS) does not indicate coincidence, the compression of the trace information is not performed.

Figure 6:
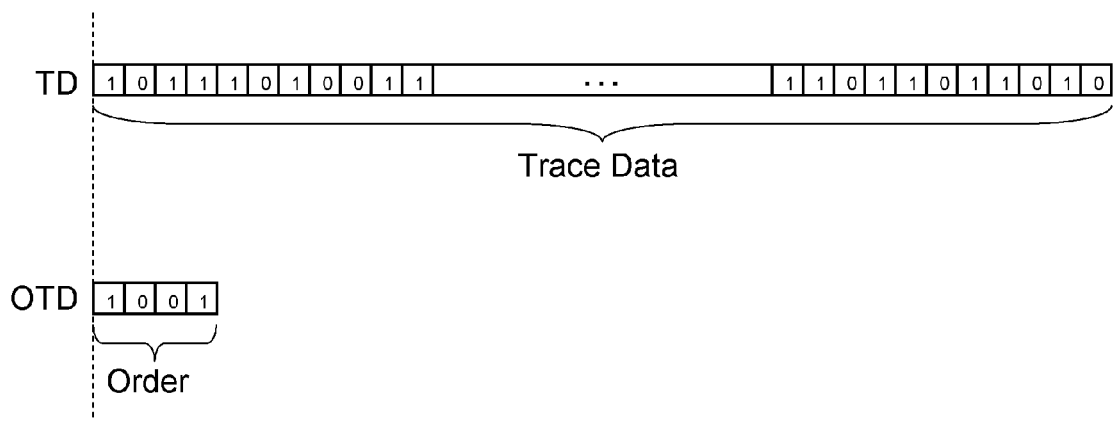
FIG. 6 is an explanatory chart of a trace information in the second embodiment.

FIG. 6 illustrates the relationship between the trace information (TD: Trace Data) and the order compression trace information (OTD: Order).

In comparison with the trace restoration controller (TRC) 310 illustrated in FIG. 4 in the first embodiment, the trace restoration controller (TRC) 310' illustrated in FIG. 7 in the second embodiment removes the index eliminator (IE) 311, and adds instead a newest number storage unit (NM) 315 and a region number determination unit (RD) 316.

The restoring unit (RU) 312 of the second embodiment reads the order number (ON) used for compression from the order compression trace information (OTD) which is inputted into the trace restoration controller (TRC) 310, and outputs the order number (ON) read to the restoration controller (RC) 314. The number of a storage region, in which the pre-compression trace information (TD) corresponding to the compressed order number (ON) is stored, is calculated by the restoration controller (RC) 314, the newest number storage unit (NM) 315, and the region number determination unit (RD) 316. The pre-compression trace information (TD) corresponding to the calculated storage region number is read from the storage unit (MU) 320 and inputted into the restoring unit (RU) 312. The restoring unit (RU) 312 outputs the pre-compression trace information (TD) to the selector 313.

The restoration controller (RC) 314 receives the order number (ON) from the restoring unit (RU) 312, and controls the selector (SEL) 313 and the newest number storage unit (NM) 315 according to the order number received. The restoration controller (RC) 314 also outputs the order number (ON) to the storage unit (MU) 320 and the region number determination unit (RD) 316.

The newest number storage unit (NM) 315 of the second embodiment stores the information indicative of what number storage region of the n-piece storage regions currently stores the newest trace information, and outputs the information to the region number determination unit (RD) 316.

Using the value of newest number storage unit (NM) 315 and the order number (ON) inputted from restoring unit (RU) 312, the region number determination unit (RD) 316 of the second embodiment calculates which area number of the storage unit (MU) 320 stores the pre-compression trace information (TD) corresponding to the order number (ON), and outputs the calculated result to the storage unit (MU) 320.

In the first and the second embodiment described above, it is explained that all the bits of the trace information serve as a target of the coincidence/no-coincidence detection. Alternatively, however, it is also possible that a part of the bits of the trace information is used as a target of the coincidence/no-coincidence detection. Also, as for the trace information, only a part of the trace information can be treated as the compression target. For example, in the trace information, only the address can be treated as a compression target or only the data can be treated as a compression target. The change of the compression target can be practiced by a flag set at a proper register provided within the trace compression controller (TCC) 220'.

The invention accomplished by the present inventor has been explained concretely in the above. However, it cannot be overemphasized that the present invention is not limited to the explanation made above, but can be changed variously in the range which does not deviate from the gist.

The above explanation has treated the case where the invention accomplished by the present inventor is mainly applied to the micro-processor which is the use field explained as the background. However, the present invention is not limited to the micro-processor, but can be applied also to a semiconductor integrated circuit.

The present invention can be applied to the semiconductor integrated circuit on condition that the semiconductor integrated circuit includes a processing unit which is operable to output the trace information at least.

What is claimed is:

1. A semiconductor integrated circuit comprising:
   a processing unit that performs arithmetic processing according to a predetermined program and outputs trace information with respect to the arithmetic processing; and
   a trace compression unit that compresses the trace information outputted from the processing unit,
   wherein the trace compression unit comprises a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit,
   wherein, when the newly-outputted trace information from the processing unit is in disagreement with the trace information stored in the storage device, the trace information compression controller stores the newly-outputted trace information into the storage device after appending an index number to the newly-outputted trace information, and
   wherein, when the newly-outputted trace information from the processing unit is in agreement with the trace information stored in the storage device, the trace information compression controller compresses the trace information to be externally outputted by replacing the trace information to be externally outputted with an index number appended to the trace information concerned in the storage device.

2. The semiconductor integrated circuit according to claim 1,
   wherein the trace information compression controller includes a register that sets up information to be a compression target in the trace information, and
   wherein the information to be the compression target is determined according to the setting information in the register concerned.

3. A semiconductor integrated circuit comprising:
   a processing unit that performs arithmetic processing according to a predetermined program and outputs trace information with respect to the arithmetic processing; and
   a trace compression unit that compresses the trace information outputted from the processing unit, wherein the trace compression unit comprises a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit, wherein, when the newly-outputted trace information from the processing unit is in disagreement with the trace information stored in the storage device, the trace information compression controller stores the newly-outputted trace information into the storage device, and wherein, when the newly-outputted trace information from the processing unit is in agreement with the trace information stored in the storage device, the trace information compression controller compresses the trace information to be externally outputted by replacing the trace information to be externally outputted with information indicative of storing order of the trace information concerned in the storage device.

4. The semiconductor integrated circuit according to claim 3, wherein the trace information compression controller includes a register that sets up information to be a compression target in the trace information, and wherein the information to be the compression target is determined according to the setting information in the register concerned.

5. A debugging system comprising:

a semiconductor integrated circuit; and a debugging device that restores information outputted from the semiconductor integrated circuit, wherein the semiconductor integrated circuit includes a processing unit that performs arithmetic processing according to a predetermined program and outputs trace information with respect to the arithmetic processing; and a trace compression unit that compresses the trace information outputted from the processing unit, wherein the trace compression unit includes a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit, and wherein the debugging device includes a trace restoring unit that restores trace information by replacing the trace information with the content of the trace information indicated by the index number.

6. A debugging system comprising:

a semiconductor integrated circuit; and a debugging device that restores information outputted from the semiconductor integrated circuit, wherein the semiconductor integrated circuit includes a processing unit that performs arithmetic processing according to a predetermined program and outputs trace information with respect to the arithmetic processing; and a trace compression unit that compresses the trace information outputted from the processing unit, wherein the trace compression unit includes a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit, and wherein the debugging device includes a trace restoring unit that restores trace information by replacing the trace information with information indicative of the storing order of the trace information in the storage device.

7. A debugging system comprising:

a semiconductor integrated circuit; and a debugging device that restores information outputted from the semiconductor integrated circuit, wherein the semiconductor integrated circuit includes a processing unit that performs arithmetic processing according to a predetermined program and outputs trace information with respect to the arithmetic processing; and a trace compression unit that compresses the trace information outputted from the processing unit, wherein the trace compression unit includes a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit, wherein, when the newly-outputted trace information from the processing unit is in disagreement with the trace information stored in the storage device, the trace information compression controller stores the newly-outputted trace information into the storage device after appending an index number to the newly-outputted trace information, and wherein, when the newly-outputted trace information from the processing unit is in agreement with the trace information stored in the storage device, the trace information compression controller compresses the trace information to be externally outputted by replacing the trace information to be externally outputted with an index number appended to the trace information concerned in the storage device.

8. The debugging system according to claim 7, wherein the trace information compression controller includes:

a register that sets up information to be a compression target in the trace information, and wherein the information to be the compression target is determined according to the setting information in the register concerned.

9. A debugging system comprising:

a semiconductor integrated circuit; and a debugging device that restores information outputted from the semiconductor integrated circuit, wherein the semiconductor integrated circuit includes a processing unit that performs arithmetic processing according to a predetermined program and outputs trace information with respect to the arithmetic processing; and a trace compression unit that compresses the trace information outputted from the processing unit, wherein the trace compression unit includes a storage device that stores the trace information outputted from the processing unit; a comparator unit that compares trace information stored in the storage device with the trace information newly outputted from the processing unit and outputs a comparison result; and a trace information compression controller that compresses trace information to be externally outputted, based on the comparison result of the comparator unit, wherein, when the newly-outputted trace information from the processing unit is in disagreement with the trace information stored in the storage device, the trace information compression controller stores the newly-outputted trace information into the storage device, and wherein, when the newly-outputted trace information from the processing unit is in agreement with the trace information stored in the storage device, the trace information compression controller compresses the trace information to be externally outputted by replacing the trace information to be externally outputted with information indicative of storing order of the trace information concerned in the storage device.

10. The debugging system according to claim 9, wherein the trace information compression controller includes a register that sets up information to be a compression target in the trace information, and wherein the information to be the compression target is determined according to the setting information in the register concerned.

* * * * *